United States Patent
Imamura

(10) Patent No.: US 11,053,074 B2
(45) Date of Patent: Jul. 6, 2021

(54) TRANSPORT VEHICLE SYSTEM AND TRANSPORT VEHICLE ARRANGEMENT METHOD IN TRANSPORT VEHICLE SYSTEM

(71) Applicant: Murata Machinery, Ltd., Kyoto (JP)

(72) Inventor: Yuichi Imamura, Aichi (JP)

(73) Assignee: Murata Machinery, Ltd., Kyoto (JP)

( * ) Notice: Subject to any disclaimer, the term of this patent is extended or adjusted under 35 U.S.C. 154(b) by 353 days.

(21) Appl. No.: 16/180,569

(22) Filed: Nov. 5, 2018

(65) Prior Publication Data

US 2019/0177087 A1 Jun. 13, 2019

(30) Foreign Application Priority Data

Dec. 12, 2017 (JP) .............................. JP2017-237456

(51) Int. Cl.
| | |
|---|---|
| *B65G 1/06* | (2006.01) |
| *B65G 1/137* | (2006.01) |
| *H01L 21/677* | (2006.01) |

(52) U.S. Cl.
CPC ............. *B65G 1/065* (2013.01); *B65G 1/137* (2013.01); *H01L 21/67715* (2013.01); *H01L 21/67724* (2013.01); *H01L 21/67727* (2013.01); *H01L 21/67733* (2013.01)

(58) Field of Classification Search
CPC ... B65G 1/065; B65G 1/137; H01L 21/67715; H01L 21/67724; H01L 21/67727; H01L 21/67733
See application file for complete search history.

(56) References Cited

U.S. PATENT DOCUMENTS

| | | | |
|---|---|---|---|
| 2006/0280580 A1* | 12/2006 | Lutz ...................... | B65G 1/065 414/222.03 |
| 2010/0316468 A1* | 12/2010 | Lert ........................ | B65G 47/57 414/273 |
| 2014/0288696 A1* | 9/2014 | Lert ........................ | B65G 1/0492 700/216 |
| 2015/0329298 A1* | 11/2015 | Ito ...................... | H01L 21/67733 414/222.07 |
| 2018/0229936 A1* | 8/2018 | Motoori ................... | B65G 1/00 |
| 2019/0177087 A1* | 6/2019 | Imamura ................ | B65G 1/065 |

FOREIGN PATENT DOCUMENTS

JP 08-211937 A 8/1996

\* cited by examiner

*Primary Examiner* — Jason C Smith
(74) *Attorney, Agent, or Firm* — DLA Piper LLP (US)

(57) ABSTRACT

A transport vehicle system includes: a plurality of transport vehicles that transport articles; a main track, and a plurality of branch tracks branching off from the main track at different positions of the main track; and a controller that, with each of the branch tracks and a part of the main track taken as a reciprocation traveling track, causes each of the plurality of transport vehicles to reciprocate in the reciprocation traveling track and transport an article, and when a transport vehicle is placed on any of the reciprocation traveling tracks, the controller causes a transport vehicle that is reciprocating on a reciprocation traveling track in front of the reciprocation traveling track of placement destination in the extending direction, to retreat to the branch track in the reciprocation traveling track and thereafter causes passage of the transport vehicle to be placed through the main track in the reciprocation traveling track.

5 Claims, 5 Drawing Sheets

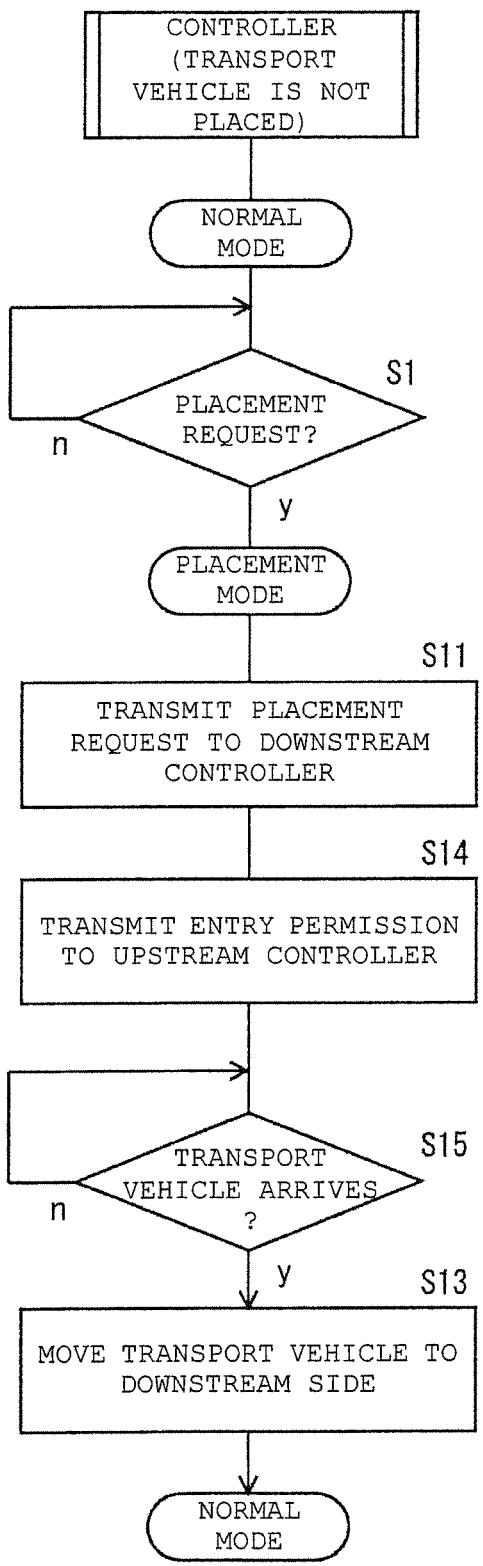

TRANSPORT VEHICLE SYSTEM AND TRANSPORT VEHICLE ARRANGEMENT METHOD IN TRANSPORT VEHICLE SYSTEM

TECHNICAL FIELD

This disclosure relates to a transport vehicle system and a transport vehicle placement method in the transport vehicle system.

BACKGROUND

WO2015/174180A describes a transport vehicle system in which, in a layout where U-shaped reciprocation traveling tracks each made up of a first track and a branch track are connected to each other, transport vehicles placed one by one on the respective reciprocation traveling tracks transport articles between buffers and load ports while traveling along the reciprocation traveling tracks.

In WO2015/174180A, the reciprocation traveling track is connected to a track for an overhead transport vehicle, thereby enabling placement of a transport vehicle on the reciprocation traveling track from the track for the overhead transport vehicle. However, WO2015/174180A does not describe processing of automatically placing the transport vehicle on the reciprocation traveling track. Conventionally, at the time of placing a transport vehicle on a predetermined reciprocation traveling track in the transport vehicle system, a transport vehicle on each reciprocation traveling track has been moved by manual operation using, for example, a remote controller to a position where the transport vehicle will not prevent passage of the transport vehicle to be placed, and the transport vehicle to be placed has then been caused to pass also by the manual operation.

It could therefore be helpful to reduce human work at the time of placing a transport vehicle on a reciprocation traveling track.

SUMMARY

We thus provide:

A transport vehicle system including: a plurality of transport vehicles that transport articles; a main track, and a plurality of branch tracks respectively branching off from the main track at different positions in an extending direction of the main track; and a controller that, with each of the branch tracks and a part of the main track taken as a reciprocation traveling track, causes each of the plurality of transport vehicles to reciprocate in the reciprocation traveling track and transport an article, and when a transport vehicle is placed on any of the reciprocation traveling tracks, the controller causes a transport vehicle that is reciprocating on a reciprocation traveling track in front of the reciprocation traveling track of placement destination in the extending direction, to retreat to the branch track in the reciprocation traveling track and thereafter causes passage of the transport vehicle to be placed through the main track in the reciprocation traveling track.

A transport vehicle placement method in a transport vehicle system including a plurality of transport vehicles that transport articles, a main track, and a plurality of branch tracks respectively branching off from the main track at different positions in an extending direction of the main track, and a controller that, with each of the branch tracks and a part of the main track taken as a reciprocation traveling track, causes each of the plurality of transport vehicles to reciprocate in the reciprocation traveling track and transport an article, and the controller of the transport vehicle system is caused to execute: a step of reciprocating the transport vehicle in the reciprocation traveling track to transport an article; and a step of, when placing a transport vehicle on any of the reciprocation traveling tracks, causing a transport vehicle that is reciprocating in a reciprocation traveling track in front of the reciprocation traveling track of placement destination in the extending direction, to retreat to the branch track in the reciprocation traveling track, and thereafter causing passage of the transport vehicle to be placed through the main track in the reciprocation traveling track.

Under control of the controller, the transport vehicle is caused to retreat from the first track, and the transport vehicle to be placed is caused to travel to the reciprocation traveling track of placement destination. Hence, it is not necessary to manually operate the transport vehicle. Since a retreat destination of the transport vehicle is in the same reciprocation traveling track, when the retreat becomes unnecessary, the transport vehicle can resume transporting motion in the reciprocation traveling track where the transport vehicle was reciprocating before the retreat, without going through another reciprocation traveling track.

Preferably, the controller causes a transport vehicle reciprocating in a reciprocation traveling track on which the transport vehicle to be placed is located and a transport vehicle being reciprocated in a reciprocation traveling track through which the transport vehicle to be placed next passes to retreat to the branch tracks in the respective reciprocation traveling tracks, the controller permits transporting motion of a transport vehicle on the main track in the reciprocation traveling track which is closer to the reciprocation traveling track of placement destination than the next passing reciprocation traveling track, and after the transport vehicle to be placed completes passing through the reciprocation traveling track, the controller causes the transport vehicle on the main track in the reciprocation traveling track to resume transporting motion. The transport vehicle which does not need to retreat is caused to continue transporting motion of an article and the transport vehicle for which the retreat has become unnecessary is caused to immediately resume transporting operation of the article so that the placement affects a little on the transport. The interruption includes temporarily storing the article in a buffer and stopping the transfer.

Preferably, the controller causes transport vehicles, located from a starting position of the transport vehicle to be placed to the reciprocation traveling track of placement destination and being reciprocated in reciprocation traveling tracks, to retreat all at once to the branch tracks in the respective reciprocation traveling tracks. It is unnecessary for the transport vehicle to be placed to wait for the retreat of the transport vehicle in the reciprocation traveling track in front of each reciprocation traveling track, whereby the transport vehicle can be placed on the reciprocation traveling track of placement destination in a short time.

Preferably, the main track is linear, the branch track is made up of an arcuate branching and joining track and a linear second track, and the reciprocation traveling track has a U-shape as a whole. Since the transport vehicle can be caused to travel straight and placed on the placement destination, the transport vehicle can be placed in a short time.

Further, a transport vehicle system includes: a plurality of transport vehicles that transport articles; a main track, and a plurality of branch tracks respectively branching off from the main track at different positions in an extending direction of the main track; and a controller that, with each of the branch tracks and a part of the main track taken as a reciprocation traveling track, causes each of the plurality of transport vehicles to reciprocate in the reciprocation traveling track and transport an article, and when a transport vehicle is placed on any of the reciprocation traveling tracks, the controller causes a transport vehicle, located from a starting position to the reciprocation traveling track of placement destination to move to a reciprocation traveling track which is downstream by at least one reciprocation traveling track along a traveling direction of the transport vehicle to be placed so that the transport vehicle is placed on the reciprocation traveling track of placement destination and the reciprocation traveling track on which the transport vehicle is placed before the placement.

Also, in this case, the transport vehicle can be placed without manual operation of the transport vehicle. Further, the transport vehicle can be placed on the reciprocation traveling track of placement destination in a short time.

BRIEF DESCRIPTION OF THE DRAWINGS

FIG. 5 is a flowchart illustrating a placement algorithm in an area in which no transport vehicle is placed in the second example.

DETAILED DESCRIPTION

My methods and systems are described in detail. The scope of this disclosure is intended to be determined in accordance with understanding of those skilled in the art with reference to the description and well-known techniques in the field.

Figure 1:
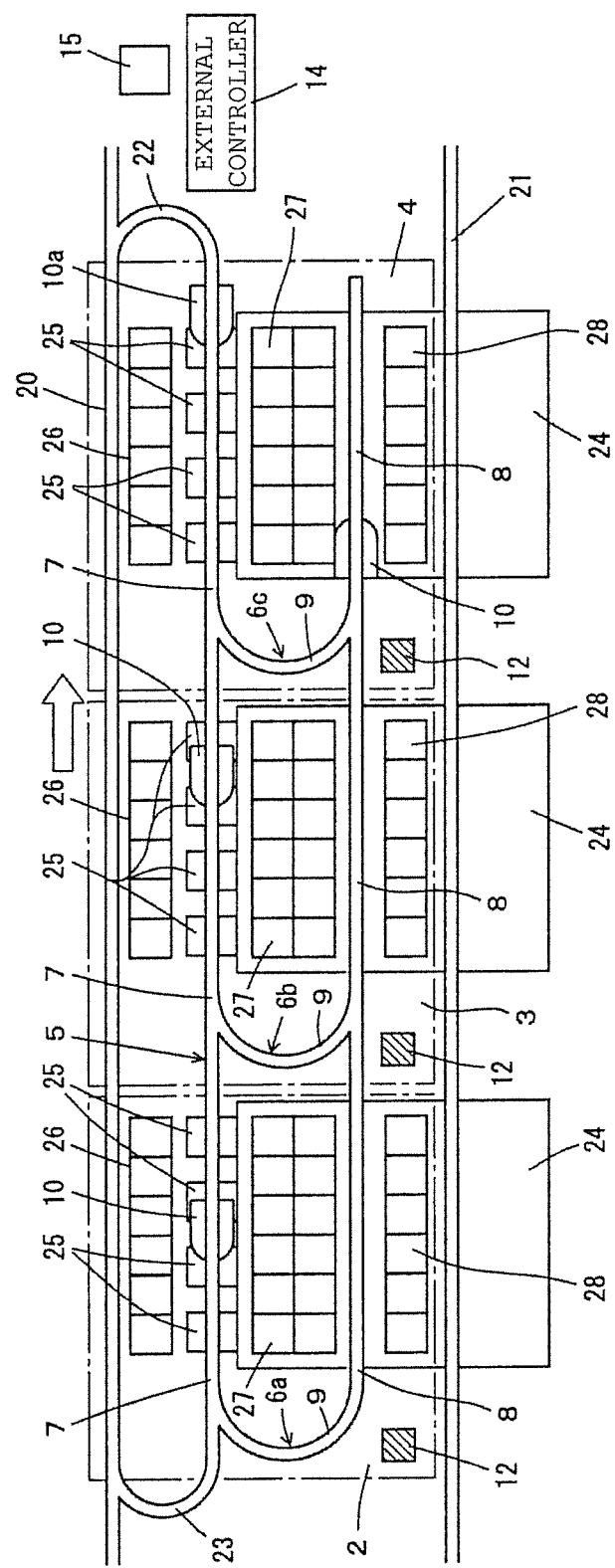
FIG. 1 is a view illustrating a layout of a transport vehicle system of an example.
Figure 2:
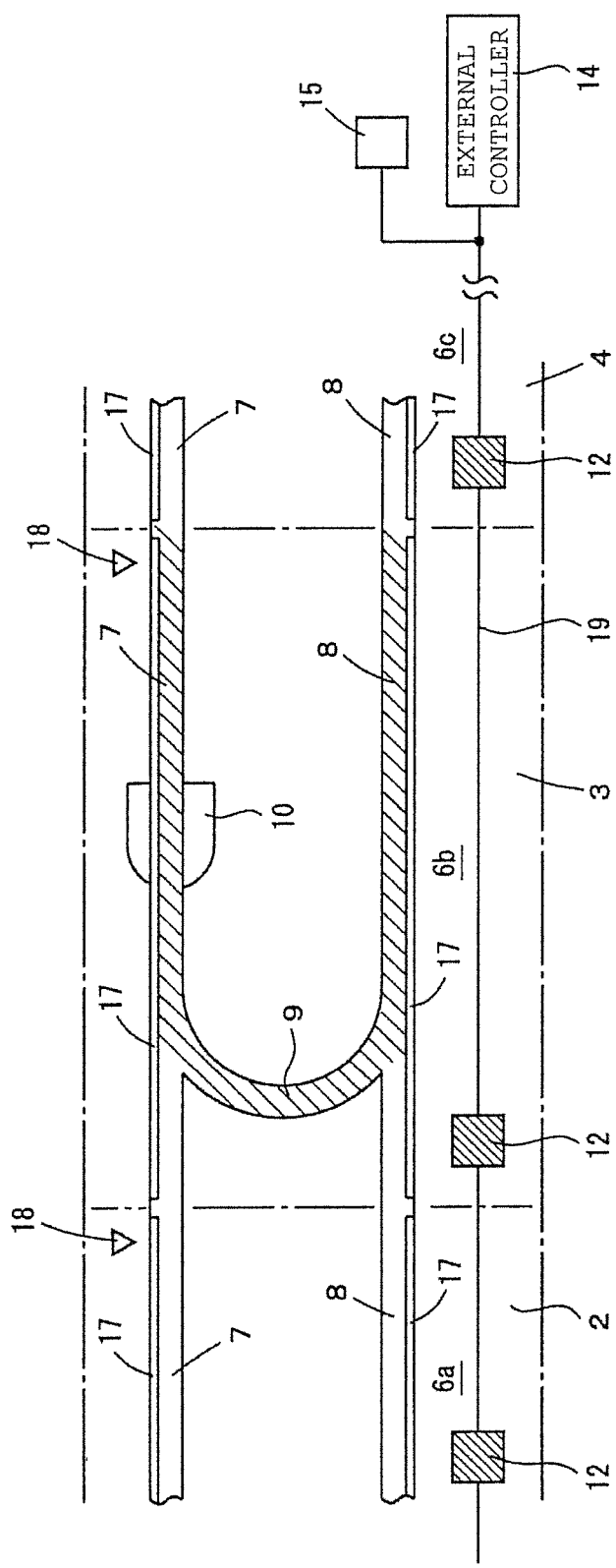
FIG. 2 is a view illustrating the transport vehicle system of the example in an enlarged manner for one area.
Figure 3:
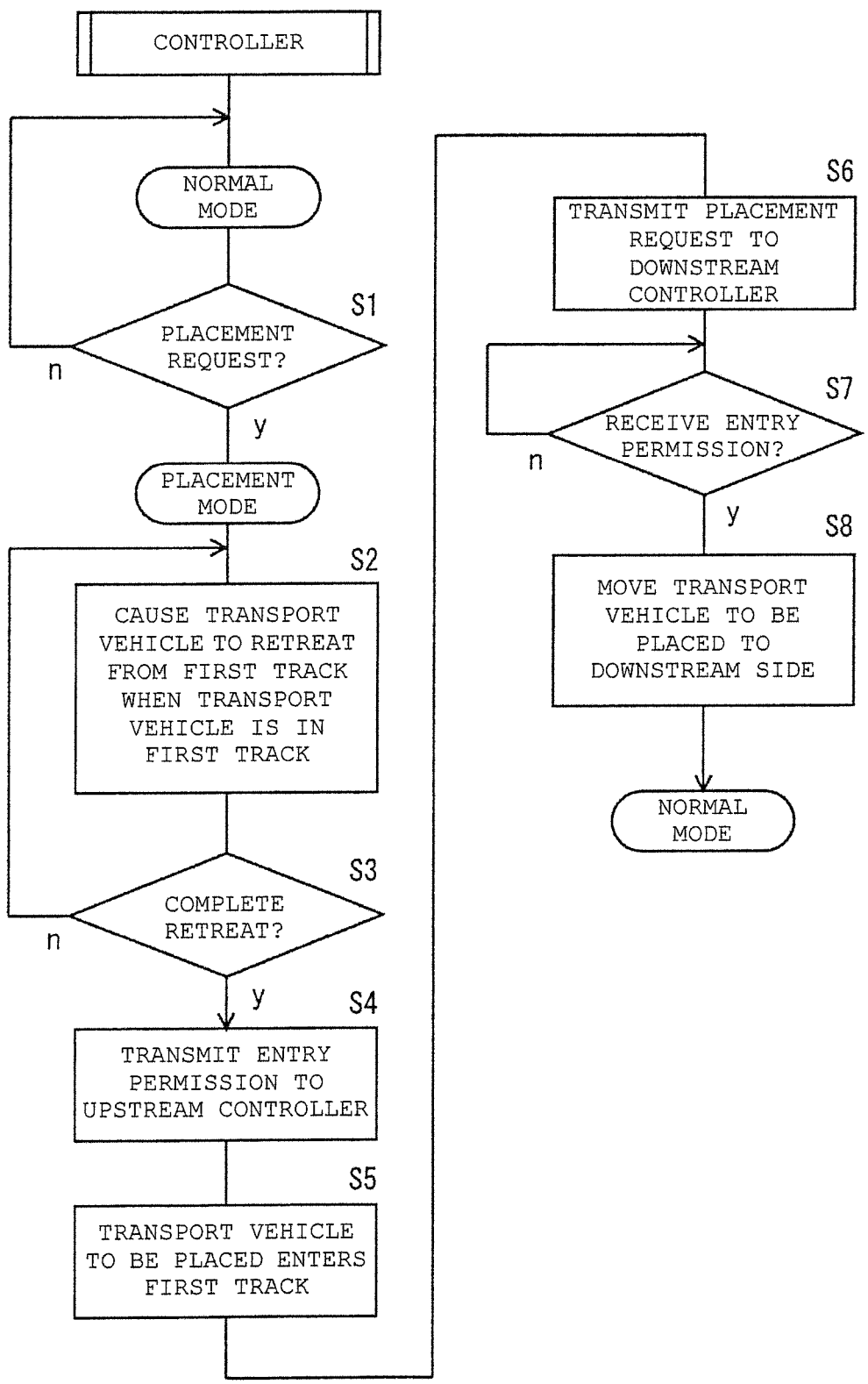
FIG. 3 is a flowchart illustrating a placement algorithm for one area in the example.

FIGS. 1 to 3 illustrate a transport vehicle system according to an example. FIG. 1 illustrates a layout of the transport vehicle system. A plurality of areas 2 to 4 are respectively provided with reciprocation traveling tracks 6a to 6c on which transport vehicles 10a to 10c (simply referred to as a transport vehicle 10 when not particularly distinguished) reciprocate, and the area is a concept including the track and the transport vehicle. Each of the reciprocation traveling tracks 6a to 6c for one area is formed of a linear first track 7 and a branch track made up of a linear second track 8 and an arcuate branching and joining track 9 which branches off from the first track 7 and joins the second track 8, and has a U-shape as a whole. The linear tracks 7, 8 are both sides of the U-shape, and the branching and joining track 9 is a bottom side of the U-shape. The first tracks 7, 7 connect to each other at a boundary of the areas 2, 3 and at a boundary of the areas 3, 4 to form a linear main track 5 as a whole. In the example, the second tracks 8, 8 also connect to each other at the boundary between the areas 2, 3 and the boundary between the areas 3, 4, but the second tracks 8, 8 may not connect to each other. In the example, three areas 2 to 4 connect, but the number of areas 2 to 4 may only be plural.

The reciprocation traveling tracks 6a to 6c are, for example, provided in a ceiling space of a clean room or, for example, provided in a space above a processing device 24. The transport vehicles 10a to 10c travel along the reciprocation traveling tracks 6a to 6c in the respective areas 2 to 4 (without going out of the respective areas) and transport articles. The areas 2 to 4 are normally set in a normal mode and, in this mode, the transport vehicles 10a to 10c reciprocate on the reciprocation traveling tracks 6a to 6c provided in the respective areas 2 to 4. Furthermore, the number of transport vehicles 10 placed in each of the areas 2 to 4 is, for example, one, but may be plural. The areas 2 to 4 may be provided on a floor of a building or the like.

A controller 12 is provided in each of the areas 2 to 4 and controls the transport vehicle 10 in each of the areas 2 to 4. However, the transport vehicles 10 in the plurality of areas may be collectively controlled by one controller. The controller 12 receives a command from an external controller 14 or a terminal 15 and controls the transport vehicle 10 to transport an article in each area in accordance with the command.

Reference numerals 20, 21 denote tracks for an overhead transport vehicle 11. The tracks 20, 21 are, for example, inter-process tracks connecting between processes and connect the transport vehicle system illustrated in FIG. 1 and another transport system, not illustrated. That is, the overhead transport vehicle 11 transports an article between the transport vehicle system illustrated in FIG. 1 and another transporting system, not illustrated. The track 20 for the overhead transport vehicle 11 connects to the area 4 and the area 2 via connection portions 22, 23. One of the areas 2 and 4 may connect to the track 20 for the overhead transport vehicle 11. The transport vehicle 10 is, for example, a device of a similar type to the overhead transport vehicle 11, and the transport vehicle 10 can also freely travel on the track 20. At the time of placing a new transport vehicle 10, a vehicle 10 subjected to maintenance or the like in any of the areas 2 to 4 (on any of the reciprocation traveling tracks 6a to 6c), the transport vehicle 10 to be placed is caused to enter from the track 20 to the connection portion 22 and move to the desired area of the areas 2 to 4. Further, at the time of removing the transport vehicle 10 from the areas 2 to 4 for maintenance or the like, the transport vehicle 10 to be removed is moved from the connection portion 23 to the track 20.

Reference numeral 24 denotes a processing device for a semiconductor or the like, reference numeral 25 denotes a load port of the processing device, and reference numerals 26 to 28 denote buffers to temporarily store articles. In the normal mode, the transport vehicle 10 travels in each area and transports an article between the load port 25 and each of the buffers 26 to 28, for example. The overhead transport vehicle 11 travels along the tracks 20, 21 and passes and receives an article to and from the buffers 26 and 28. Then, the transport vehicle 10 and the overhead transport vehicle 11 transfer articles in the clean room. Note that the overhead transport vehicle 11, its tracks 20, 21, the processing device 24, or the load port 25 is not a part of the transport vehicle system of the example.

FIG. 2 illustrates a configuration of the area 3, and a track of a portion hatched in the area 3 is the reciprocation traveling track 6b for the transport vehicle 10. A track not hatched in the area 3 is a track for the transport vehicle 10, but is not included in the reciprocation traveling track. This also applies to the other areas 2 and 4. For example, a scale 17 such as a magnetic scale is provided along each of the first track 7 and the second track 8, and a position sensor, not illustrated, of the transport vehicle 10 reads a position of the transport vehicle 10 from the scale 17 and reports the position to the controller 12. Instead of the scale 17, a sensor 18 may be provided at a connection portion of the first tracks 7, 7 to detect that the transport vehicle 10 has moved from the area 3 to the area 2, or moved from the area 4 to the area 3. Further, the controller 12, the external controller 14, and the terminal 15 communicate via a LAN 19. In each of the areas 2 to 4, thus, in each of the reciprocation traveling tracks 6a to 6c, each of the transport vehicles 10a to 10c reciprocates along the U-shaped traveling route made up of the tracks 7, 8 and the branching and joining track 9, and transports articles between the load port 25 and the buffers 26 to 28 in FIG. 1.

FIG. 3 illustrates a placement algorithm of the transport vehicle 10 for one area in the example, and the controller 12 in each area 2 to 4 executes the algorithm of FIG. 3. FIG. 3 illustrates control at the time of placing the transport vehicle 10 in each area. A description will be given taking a case as an example where transport vehicle 10a near the connection portion 22 is placed in the area 2 (the reciprocation traveling track 6a) in FIG. 1. The area 4 is a track upstream of the area 3 and the area 2, and area 3 is an area upstream of the area 2. In this example, the transport vehicle 10a is moved from the upstream side to the downstream side for placement. Further, in accordance with upstream-downstream relationship among the areas 2 to 4, upstream-downstream relationship among the controllers 12 and upstream-downstream relationship among the reciprocation traveling tracks 6a to 6c are determined.

For example, it is assumed that in a state where the transport vehicle 10a is not placed in the area 2, placement of the transport vehicle 10a in the area 2 (on the reciprocation traveling track 6a) is requested from the external controller 14 or the terminal 15. This request is sent to the controller 12 in the most upstream area 4 (step S1), and the controller 12 sets the area 4 in a placement mode. In the placement mode, the controller 12 confirms a position of the transport vehicle 10c in the reciprocation traveling track 6c. Then, when the transport vehicle 10c is at a position in the first track 7, or at a position in the branching and joining track 9 where the transport vehicle 10c may interfere with the transport vehicle 10a traveling on the first track 7, the controller 12 causes the transport vehicle 10c to retreat to a position in the second track 8 or a position in the branching and joining track 9 where the transport vehicle 10c will not interfere with the transport vehicle 10a traveling on the first track 7 (step S2). Alternatively, when there is a possibility of interfering with the transport vehicle 10a, the transport vehicle 10c stops transporting operation in execution.

When the retreat of the transport vehicle 10c in the area 4 is completed (step S3), the controller 12 transmits an entry permission for the transport vehicle 10a to the terminal 15 or the external controller 14 (step S4). Upon receipt of the entry permission, the terminal 15 or the external controller 14 causes the transport vehicle 10a to enter the first track 7 in the area 4 (step S5). This also applies to processing in the areas 3, 2. In step S5, the upstream controller 12 having received the entry permission causes the transport vehicle 10a to enter the first track 7 in the downstream areas 3, 2.

The controller 12 in the area 4 where the transport vehicle 10a has entered transmits a placement request to the controller 12 in the downstream area 3 (step S6). When the transport vehicle 10a enters the area 3, the controller 12 transmits a placement request to the controller 12 in the downstream area 2. Upon receipt of the entry permission from the controller 12 in the downstream area (step S7), the controller 12 in the upstream area causes the transport vehicle 10a to move to the first tracks 7 in the downstream areas 3, 2 (step S8). The controller 12 returns the areas 4, 3, through which the transport vehicle 10a has passed, to the normal mode. That is, when the transport vehicle 10a finishes traveling in the first track 7 in each area (passing through each area and going out to an adjacent area), the controller 12 controls the transport vehicle 10 in the area to immediately resume the stopped transporting operation. Further, the controller 12 in the area 2 sets the area 2 in the normal mode when the transport vehicle 10a arrives. This enables passage of the transport vehicle 10a through the areas 4, 3 and placement of the transport vehicle 10a in the area 2.

The example has features as follows:
1) The transport vehicle 10a can be placed under control of the controller 12. Hence, it is not necessary to manually operate the transport vehicle 10a.
2) Since the transport vehicle 10 retreats in each area, when the transport vehicle 10a finishes passing therethrough, the transport vehicle 10 can immediately resume the transporting operation of an article. For example, when the transport vehicle 10 is transporting an article, an unloading destination of the article is in the same area. When the transport vehicle 10 is in a state prior to loading of the article, a position for loading is also in the same area.
3) A plurality of controllers 12 cooperate to place the transport vehicle 10a.
4) The maximum number of areas simultaneously set in the placement mode is two, and an article transport delay due to the placement is small compared to when all the areas 2 to 4 are simultaneously set in the placement mode. That is, transporting motion of the transport vehicle may be stopped only in the minimum necessary area, and it is thus possible to reduce deterioration in transport efficiency due to the placement.
5) With the plurality of first tracks 7 being linearly placed, it is possible to move the transport vehicle 10a to be placed straight to the reciprocation traveling track 6a of placement destination.

In FIG. 3, when the placement request is received in step S1, step S6 may be immediately executed and a placement request may be transmitted to the downstream controller 12. In this case, all the areas 2 to 4 are simultaneously set in the placement mode. Hence, all the transport vehicles 10 required to retreat can be caused to retreat all at once and the transport vehicle 10a can be placed promptly. However, doing this increases the article transport delay due to the placement. If there is a track on which the transport vehicle 10 is not placed and the transport vehicle 10a to be placed is caused to pass through this track, steps S2 and S3 in FIG. 3 may be omitted and other steps may be executed in the same manner.

Also, when the transport vehicle 10 is removed from the reciprocation traveling tracks 6a to 6c for maintenance or the like, the removal can be performed by a similar algorithm to that in FIG. 3. In the removal, the placement destination of the transport vehicle 10 is considered to be the connection portion 23, and the starting position of the transport vehicle 10 may not be the connection portion 22 or the like, but be a track where the transport vehicle 10 to remove is located. Since the algorithm of FIG. 3 does not depend on either the starting position or the placement destination of the transport vehicle 10, it is possible to cause the transport vehicle to retreat by a similar algorithm to that in FIG. 3.

Figure 4:
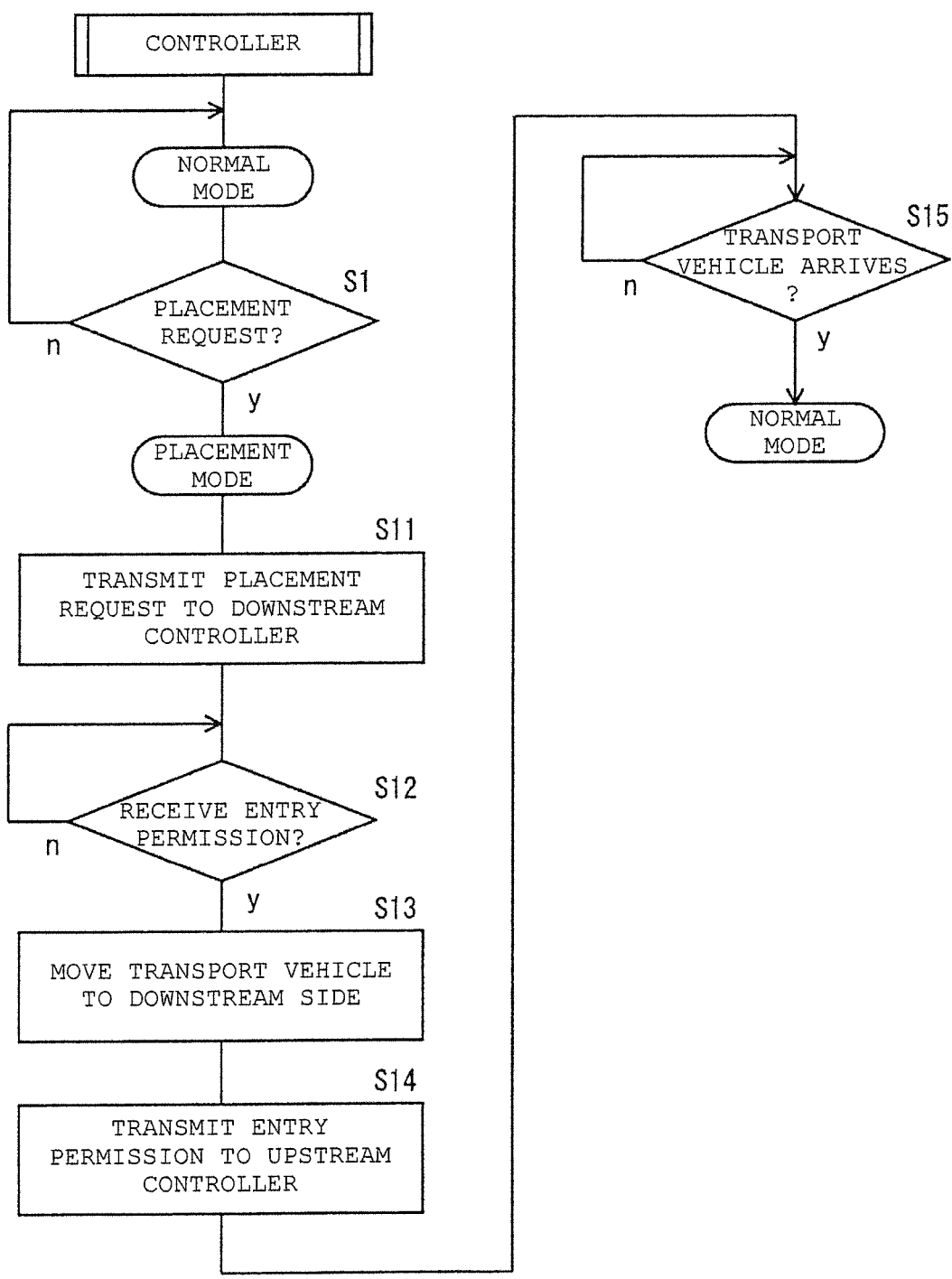
FIG. 4 is a flowchart illustrating a placement algorithm for one area in a second example.

FIGS. 4 and 5 illustrate placement algorithms in a second example. FIG. 4 illustrates an algorithm executed by the controller 12 in an area where the transport vehicle 10 is placed. FIG. 5 illustrates an algorithm executed by the controller 12 in an area where the transport vehicle 10 is not placed. Upon receipt of a placement request from the upstream controller 12, the external controller 14, or the terminal 15 in step S1, the controller 12 sets the area controlled by itself in the placement mode and transmits the placement request to the downstream controller 12 (step S11). Therefore, all the areas 2 to 4 are set in the placement mode all at once.

Next, upon receipt of an entry permission for the transport vehicle 10 from the downstream controller 12 (step S12), the controller 12 causes the transport vehicle 10 to move to the first track 7 in the downstream area (step S13), and when the transport vehicle 10 moves to the first track 7 in the downstream area, the controller 12 transmits an entry permission for the transport vehicle 10 to the upstream controller 12 (step S14). When the transport vehicle 10 arrives from the upstream area (step S15), the area is returned to the normal mode, and the transporting operation is executed.

FIG. 5 illustrates processing of the controller 12 in the area where the transport vehicle 10 is not placed. Upon receipt of a placement request, the controller 12 executes step S11, skips steps S12 and S13 due to there being no transport vehicle, and executes step S14. Then, the transport vehicle arriving from the upstream side is moved to the downstream area (steps S15, S13).

In the algorithm of FIGS. 4 and 5, the transport vehicle 10 is moved to one area at a time to the downstream area (FIGS. 4 and 5).

If the area where the transport vehicle 10 is not placed is in the middle, the transport vehicle 10 is moved to the area downstream of the area (FIG. 5).

The algorithms illustrated in FIGS. 4 and 5 are unsuitable for removing a specific transport vehicle 10. Thus, in the removal, the algorithm of FIG. 3 is implemented.

The example of FIGS. 4 and 5 has features as follows:
1) By each transport vehicle moving forward to the downstream area, the transport vehicle is placed in the area of placement destination.
2) The transport vehicle is placed under control of the controller 12 so that it is not necessary to manually operate the transport vehicle.
3) Compared to the algorithm in FIG. 3, the transport vehicle can be placed promptly. That is, the transport vehicle can be placed in the area of placement destination in a short time, and a total time required for the placement is also short.

Although the methods and systems have been described in connection with specific forms thereof, it will be appreciated that a wide variety of equivalents may be substituted for the specified elements described herein without departing from the spirit and scope of this disclosure as described in the appended claims.

What is claimed is:

1. A transport vehicle placement method in a transport vehicle system including
   a plurality of transport vehicles that transport articles, a main track, and a plurality of branch tracks respectively branching off from the main track at different positions in an extending direction of the main track, and
   a controller that, with each of the branch tracks and a part of the main track taken as a reciprocation traveling track, causes each of the plurality of transport vehicles to reciprocate in the reciprocation traveling track and transport an article,
   wherein the controller of the transport vehicle system is caused to execute:
   a step of reciprocating the transport vehicle in the reciprocation traveling track to transport an article; and
   a step of, when placing a transport vehicle on any of the reciprocation traveling tracks, causing a transport vehicle that is reciprocating in a reciprocation traveling track in front of the reciprocation traveling track of placement destination in the extending direction, to retreat to the branch track in the reciprocation traveling track, and thereafter causing passage of the transport vehicle to be placed through the main track in the reciprocation traveling track.

2. A transport vehicle system comprising:
   a plurality of transport vehicles that transport articles;
   a main track, and
   a plurality of branch tracks respectively branching off from the main track at different positions in an extending direction of the main track; and
   a controller that, with each of the branch tracks and a part of the main track taken as a reciprocation traveling track, causes each of the plurality of transport vehicles to reciprocate in the reciprocation traveling track and transport an article,
   wherein, when a transport vehicle is placed on any of the reciprocation traveling tracks, the controller causes a transport vehicle that is reciprocating on a reciprocation traveling track in front of the reciprocation traveling track of placement destination in the extending direction to retreat to the branch track in the reciprocation traveling track and thereafter causes passage of the transport vehicle to be placed through the main track in the reciprocation traveling track,
   the controller causes a transport vehicle reciprocating in a reciprocation traveling track on which the transport vehicle to be placed is located and a transport vehicle reciprocating in a reciprocation traveling track through which the transport vehicle to be placed next passes to retreat to the branch tracks in the respective reciprocation traveling tracks,
   the controller permits transporting motion of a transport vehicle on the main track in the reciprocation traveling track which is closer to the reciprocation traveling track of placement destination than the next passing reciprocation traveling track, and
   after the transport vehicle to be placed completes passing through the reciprocation traveling track, the controller causes the transport vehicle on the main track in the reciprocation traveling track to resume transporting motion.

3. The transport vehicle system according to claim 2, wherein
   the main track is linear,
   the branch track is made up of an arcuate branching and joining track and a linear second track, and
   the reciprocation traveling track has a U-shape.

4. A transport vehicle system comprising:
   a plurality of transport vehicles that transport articles;
   a main track, and
   a plurality of branch tracks respectively branching off from the main track at different positions in an extending direction of the main track; and
   a controller that, with each of the branch tracks and a part of the main track taken as a reciprocation traveling track, causes each of the plurality of transport vehicles to reciprocate in the reciprocation traveling track and transport an article,
   wherein, when a transport vehicle is placed on any of the reciprocation traveling tracks, the controller causes a transport vehicle that is reciprocating on a reciprocation traveling track in front of the reciprocation traveling track of placement destination in the extending direction to retreat to the branch track in the reciprocation traveling track and thereafter causes passage of the transport vehicle to be placed through the main track in the reciprocation traveling track, and the controller causes transport vehicles, located from a starting position of the transport vehicle to be placed to the reciprocation traveling track of placement destination and reciprocating in reciprocation traveling tracks, to retreat all at once to the branch tracks in the respective reciprocation traveling tracks.

5. The transport vehicle system according to claim 4, wherein the main track is linear, the branch track is made up of an arcuate branching and joining track and a linear second track, and the reciprocation traveling track has a U-shape.

* * * * *